United States Patent
Ebigase (10) Patent No.: US 12,412,793 B2
(45) Date of Patent: Sep. 9, 2025

(54) BONDED SUBSTRATE, AND BONDED SUBSTRATE MANUFACTURING METHOD

(71) Applicant: NGK INSULATORS, LTD., Nagoya (JP)

(72) Inventor: Takashi Ebigase, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 536 days.

(21) Appl. No.: 17/752,935

(22) Filed: May 25, 2022

(65) Prior Publication Data

US 2022/0285237 A1 Sep. 8, 2022

Related U.S. Application Data

(63) Continuation of application No. PCT/JP2020/044459, filed on Nov. 30, 2020.

(30) Foreign Application Priority Data

Dec. 3, 2019 (WO) .................. PCT/JP2019/047139

(51) Int. Cl.
*H01L 23/15* (2006.01)
*C04B 35/584* (2006.01)
(Continued)

(52) U.S. Cl.
CPC ............ *H01L 23/15* (2013.01); *C04B 35/584* (2013.01); *H01L 23/3735* (2013.01); *H05K 1/0306* (2013.01)

(58) Field of Classification Search
None
See application file for complete search history.

(56) References Cited

U.S. PATENT DOCUMENTS

| 5,503,122 A | 4/1996 | Ritland et al. |
| 2016/0002110 A1 | 1/2016 | Izumi et al. |

(Continued)

FOREIGN PATENT DOCUMENTS

| JP | 08-501500 A | 2/1996 |
| JP | 2003-101217 A | 4/2003 |

(Continued)

OTHER PUBLICATIONS

International Search Report of PCT/JP2019/047139 dated Feb. 18, 2020.

(Continued)

*Primary Examiner* — Sarah K Salerno
(74) *Attorney, Agent, or Firm* — MATTINGLY & MALUR, PC (57) ABSTRACT

A bonded substrate includes a ceramic substrate, a copper plate, and a bonding layer. The ceramic substrate has a main surface having a flat region having a maximum height Rz of 10 μm or less. The ceramic substrate has a particle-defect hole being exposed to the main surface, imparting flatness lower than flatness of the flat region to a part of the main surface, and having a depth of 10 μm or more and 60 μm or less. The copper plate includes a first portion disposed over the flat region and a second portion filling the particle-defect hole. The bonding layer includes a third portion covering the flat region and a fourth portion filling the particle-defect hole, and the second portion and the fourth portion fill 80% or more of a volume of the particle-defect hole. The bonding layer bonds the copper plate to the main surface.

13 Claims, 8 Drawing Sheets

(51) Int. Cl.
*H01L 23/373* (2006.01)
*H05K 1/03* (2006.01)

(56) References Cited

U.S. PATENT DOCUMENTS

2016/0046531 A1 2/2016 Izumi
2017/0323842 A1 11/2017 Tani et al.

FOREIGN PATENT DOCUMENTS

| | | |
|---|---|---|
| JP | 2007-242815 A | 9/2007 |
| JP | 2010-076948 A | 4/2010 |
| JP | 2013-159536 A | 8/2013 |
| JP | 2014-201483 A | 10/2014 |
| JP | 2018-506496 A | 3/2018 |
| WO | 2014/148534 A1 | 9/2014 |

OTHER PUBLICATIONS

International Search Report of PCT/JP2020/044459 dated Jan. 19, 2021.
Unexamined U.S. Appl. No. 17/752,937, filed May 25, 2022.
International Preliminary Report on Patentability received in corresponding International Application No. PCT/JP2020/044459 dated Jun. 16, 2022.
International Preliminary Report on Patentability received in corresponding International Application No. PCT/JP2019/047139 dated Jun. 16, 2022.
Extended European Search Report received in corresponding European Application No. 20897100.2 dated Oct. 12, 2023.

BONDED SUBSTRATE, AND BONDED SUBSTRATE MANUFACTURING METHOD

CROSS-REFERENCE TO RELATED APPLICATION

This application is a continuation application of PCT/JP2020/044459, filed on Nov. 30, 2020, which claims the benefit of priority of Japanese Patent Application No. PCT/JP2019/047139, filed on Dec. 3, 2019, the entire contents of which is incorporated herein by reference.

BACKGROUND OF THE INVENTION

Field of the Invention

The present invention relates to bonded substrates and bonded substrate manufacturing methods.

Description of the Background Art

Silicon nitride ceramics are highly heat conductive and highly insulating. A bonded substrate in which a copper plate is bonded to a silicon nitride ceramic substrate through a bonding layer is thus suitable for use as an insulating heat-dissipating substrate on which a power semiconductor device is mounted.

Electrical breakdown of the bonded substrate occurs in two modes. In the first mode, due to application of an electric field exceeding a dielectric breakdown voltage in particles constituting the silicon nitride ceramic substrate or of grain boundaries between the particles to the bonded substrate, electrical breakdown starts to occur at an end of the copper plate on which the electric field is concentrated. In the second mode, as a result that a crack is formed by partial discharge starting at a defect, such as a void, of the silicon nitride ceramic substrate and the formed crack is developed, electrical breakdown starts to occur at the defect.

Electrical breakdown occurring in the above-mentioned first mode can easily be found by conducting a withstand voltage test on the bonded substrate before shipment of the bonded substrate as a product. Shipment of the bonded substrate wherein electrical breakdown might occur in the above-mentioned first mode is thus easily avoided.

Defects of the silicon nitride ceramic substrate can be classified into a defect isolated in the substrate and a defect exposed to the surface of the substrate.

The defect isolated in the substrate is formed by inclusion of foreign matter into a raw slurry, retention of coarse agglomerated particles in the raw slurry caused due to poor dispersion of a raw powder in the raw slurry, and the like in the process of manufacturing the silicon nitride ceramic substrate.

The defect exposed to the surface of the substrate is formed by adherence of foreign matter to the surface of an intermediate product manufactured in the process of manufacturing the silicon nitride ceramic substrate, volatilization of an aid from the surface of the intermediate product during sintering of the intermediate product, and the like.

From among these defects, the defect isolated in the substrate can easily be reduced by filtration of the raw slurry before molding and the like. It is thus easily avoided to ship the bonded substrate in which electrical breakdown due to partial discharge starting at the defect isolated in the silicon nitride ceramic substrate, among electrical breakdown in the above-mentioned second mode, might occur.

However, it is not easy to find partial discharge starting at the defect exposed to the surface of the silicon nitride ceramic substrate even when the withstand voltage test is conducted on the bonded substrate before shipment. A partial discharge test may be conducted on the bonded substrate before shipment, but it is not easy to measure a pA-order micro-current flowing due to partial discharge, and, even in a case of having equipment enabling such measurement in principle, it is necessary to take measures against noise for such measurement, and thus it may be necessary to introduce expensive equipment. It is thus not realistic to conduct the partial discharge test on all the bonded substrates before shipment.

It is also not easy to find the defect exposed to the surface of the silicon nitride ceramic substrate through imaging of the silicon nitride ceramic substrate to which the copper plate has not been bonded. This is because such a defect only has a diameter of approximately 50 μm and a depth of approximately 20 μm, it is necessary to introduce expensive equipment to find the defect, and it is not realistic to conduct imaging on all the silicon nitride ceramic substrates used for the bonded substrates to be shipped using such equipment.

The defect exposed to the surface of the silicon nitride ceramic substrate formed by a cause as described above cannot easily be reduced in the first place.

For reasons as described above, it cannot easily be avoided to ship the bonded substrate in which electrical breakdown due to partial discharge starting at the defect exposed to the surface of the silicon nitride ceramic substrate, from among electrical breakdown occurring in the second mode, might occur.

In technology disclosed in Japanese Patent Application Laid-Open No. 2010-76948, a brazing material pattern is printed on opposite sides of a silicon nitride substrate, and the opposite sides of the silicon nitride substrate and copper plates are bonded. In the technology disclosed in Japanese Patent Application Laid-Open No. 2010-76948, a form of the surface of a ceramic substrate is controlled by a method of introducing few defects in the surface to obtain the ceramic substrate having desirable partial discharge properties.

As described above, in a case of a conventional bonded substrate, shipment of the bonded substrate in which electrical breakdown might occur due to partial discharge starting at the defect exposed to the surface of the silicon nitride ceramic substrate as a product cannot easily be avoided. The problem arises also when the silicon nitride ceramic substrate is replaced with another ceramic substrate.

SUMMARY

The present invention relates to a bonded substrate.

The bonded substrate includes a ceramic substrate, a copper plate, and a bonding layer.

The ceramic substrate has a main surface having a flat region having a maximum height Rz of 10 μm or less. The ceramic substrate has a particle-defect hole being exposed to the main surface, imparting flatness lower than flatness of the flat region to a part of the main surface, and having a depth of 10 μm or more and 60 μm or less.

The copper plate includes a first portion disposed over the flat region and a second portion filling the particle-defect hole.

The bonding layer includes a third portion covering the flat region and a fourth portion filling the particle-defect hole. The bonding layer bonds the copper plate to the main surface. The second portion of the copper plate and the fourth portion of the bonding layer fill 80% or more of a volume of the particle-defect hole.

The present invention also relates to a bonded substrate manufacturing method.

The bonded substrate manufacturing method includes a step of preparing a ceramic substrate, a step of forming a brazing material layer, a step of disposing a copper plate on the brazing material layer to obtain an intermediate product including the ceramic substrate, the brazing material layer, and the copper plate, and a step of hot pressing the intermediate product.

The ceramic substrate has a main surface having a flat region having a maximum height Rz of 10 μm or less. The ceramic substrate has a particle-defect hole being exposed to the main surface, imparting flatness lower than flatness of the flat region to a part of the main surface, and having a depth of 10 μm or more and 60 μm or less.

In the step of hot pressing the intermediate product, a portion of the copper plate is caused to enter the particle-defect hole. The copper plate is thereby deformed to include a first portion disposed over the flat region and a second portion filling the particle-defect hole. Furthermore, a portion of the brazing material layer is caused to enter the particle-defect hole. The brazing material layer is thereby changed into a bonding layer including a third portion covering the flat region and a fourth portion filling the particle-defect hole, and bonding the copper plate to the main surface. In the step, the second portion of the copper plate and the fourth portion of the bonding layer fill 80% or more of a volume of the particle-defect hole.

According to the present invention, the bonded substrate in which the portion of the copper plate and the portion of the bonding layer fill 80% or more of the volume of the particle defect hole exposed to the main surface of the ceramic substrate and having a depth of 10 μm or more and 60 μm or less can be obtained. In the bonded substrate, partial discharge starting at the particle-defect hole is suppressed. The bonded substrate in which electrical breakdown occurring due to partial discharge starting at a defect exposed to the surface of the ceramic substrate is suppressed can thereby be provided.

It is therefore an object of the present invention to provide a bonded substrate in which electrical breakdown occurring due to partial discharge starting at a defect exposed to the surface of a ceramic substrate is suppressed.

The objects, features, aspects, and advantages of the present invention will become more apparent from the following detailed description and the accompanying drawings.

DESCRIPTION OF EMBODIMENTS

1 Bonded Substrate

Figure 1:
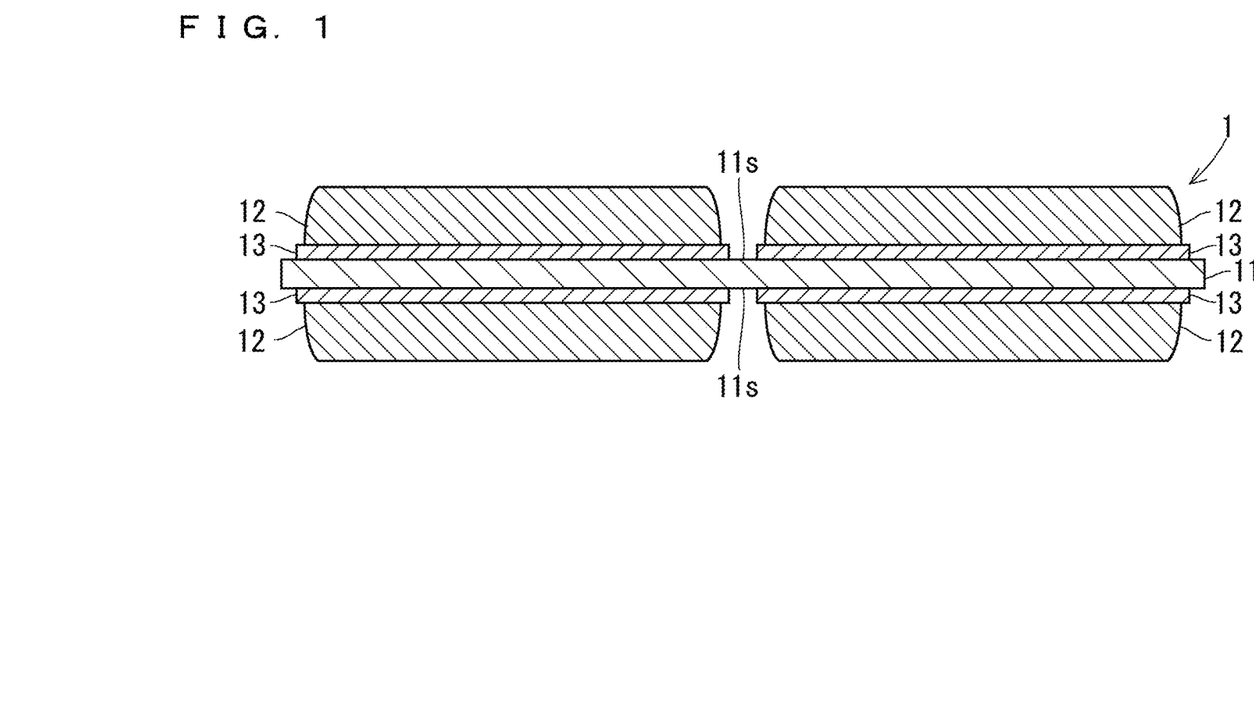
FIG. 1 is a cross-sectional view schematically showing a bonded substrate.

FIG. 1 is a cross-sectional view schematically showing a bonded substrate 1 according to an embodiment of the present invention.

The bonded substrate 1 shown in FIG. 1 includes a silicon nitride ceramic substrate 11, copper plates 12, and bonding layers 13. The silicon nitride ceramic substrate 11 may be replaced with a ceramic substrate other than the silicon nitride ceramic substrate. The bonded substrate 1 may include components other than these components.

In FIG. 1 and the following figures, a direction from the silicon nitride ceramic substrate 11 to the copper plates 12 in FIG. 1 is simply referred to as an "upward direction", and an opposite direction thereof is simply referred to as a "downward direction". Thus, in a case of FIG. 1, a direction from the silicon nitride ceramic substrate 11 to an upper copper plate 12 in FIG. 1 and a direction from the silicon nitride ceramic substrate 11 to a lower copper plate 12 in FIG. 1 each correspond to the "upward direction", and directions opposite the directions each correspond to the "downward direction".

The copper plates 12 and the bonding layers 13 are arranged over main surfaces 11s of the silicon nitride ceramic substrate 11. The bonding layers 13 bond the copper plates 12 to the main surfaces 11s of the silicon nitride ceramic substrate 11.

The bonded substrate 1 may be used in any way, and is used, for example, as an insulating heat-dissipating substrate on which a power semiconductor device is mounted.

2 Bonding Structure

Figure 2:
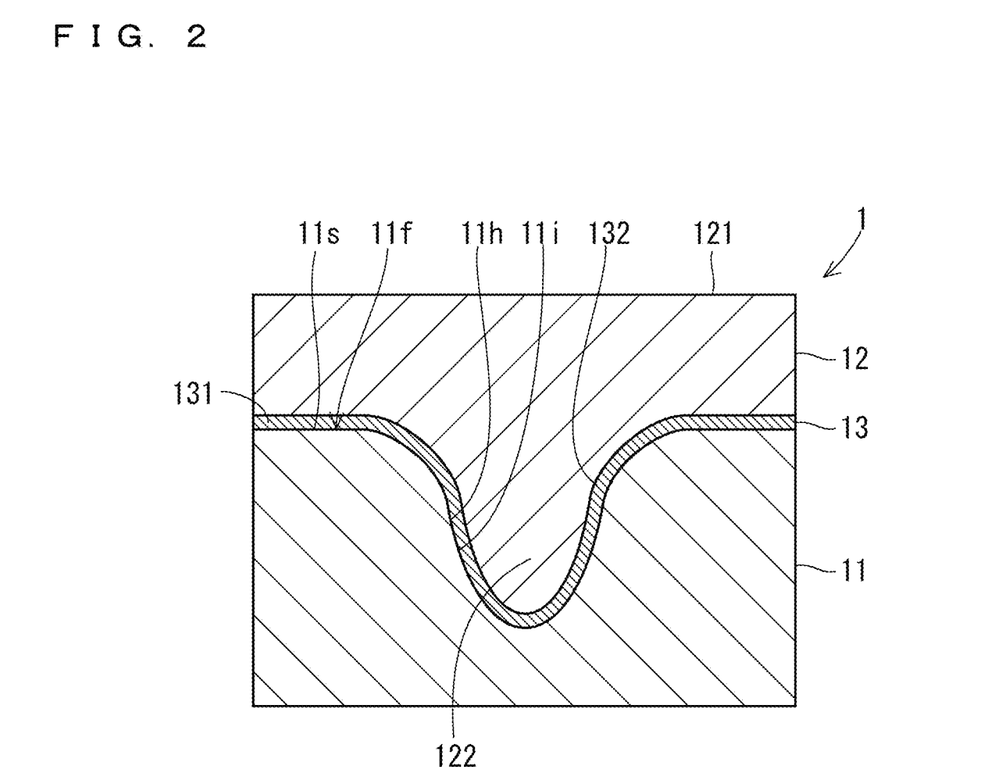
FIG. 2 is an enlarged cross-sectional view schematically showing a portion of the bonded substrate.

FIG. 2 is an enlarged cross-sectional view schematically showing a portion of the bonded substrate 1.

Each of the main surfaces 11s of the silicon nitride ceramic substrate 11 has a flat region 11f as shown in FIG. 2. The flat region 11f is a region having high flatness, and is preferably a region having a maximum height Rz of 10 μm or less. The maximum height Rz is a maximum height in a case where a reference length is 0.8 mm.

The silicon nitride ceramic substrate 11 has a particle-defect hole 11h. The particle-defect hole 11h is exposed to the main surface 11s of the silicon nitride ceramic substrate 11, and imparts flatness lower than flatness of the flat region 11f to a part of the main surface his of the silicon nitride ceramic substrate 11. The particle-defect hole 11h thus has a depth greater than the maximum height Rz of the flat region 11f. The particle-defect hole 11h is formed by adherence of foreign matter to a main surface of an intermediate product manufactured in the process of manufacturing the silicon nitride ceramic substrate 11, volatilization of an aid from the main surface of the intermediate product during sintering of the intermediate product, and the like.

In the present embodiment, the particle-defect hole 11h is shown as a typical example or a representative example of a defect exposed to the surface of the silicon nitride ceramic substrate 11. Thus, an inner surface 11i of the particle-defect hole 11h and the flat region 11f of the main surface 11s form a smoothly continuous curve in FIG. 2, but this is just a schematic example. For example, an upper end of the inner surface 11i and the flat region 11f may form an angle at least in a portion of an entrance of the particle-defect hole 11h. Even if the upper end of the inner surface 11i and the flat region 11f form an angle in the silicon nitride ceramic substrate 11 before bonding of each of the copper plates 12, the angled portion may be deformed with hot pressing for bonding.

The number of particle-defect holes 11h present in each of the main surfaces and the sizes of the particle-defect holes 11h vary among individual silicon nitride ceramic substrates 11.

The copper plate 12 includes a first portion 121 disposed over the flat region 11f of the silicon nitride ceramic substrate 11 and a second portion 122 filling the particle-defect hole 11h. The second portion 122 is continuous with the first portion 121, and is electrically connected to the first portion 121.

Each of the bonding layers 13 includes a third portion 131 covering the flat region 11f and a fourth portion 132 filling the particle-defect hole 11h.

The copper plate 12 is bonded to the silicon nitride ceramic substrate 11 through the bonding layer 13. The bonding layer 13 is generated from a brazing material layer containing active metal, and contains, as a material component, the active metal contained in the brazing material layer.

The active metal contained in the bonding layer 13 is at least one type of active metal selected from the group consisting of titanium and zirconium.

The bonding layer 13 may contain metal other than the active metal. The metal other than the active metal contained in the bonding layer 13 is at least one type of metal selected from the group consisting of silver, copper, indium, and tin.

The bonding layer 13 may contain nitrogen and/or silicon supplied from the silicon nitride ceramic substrate 11. Nitrogen and/or silicon supplied from the silicon nitride ceramic substrate 11 and the active metal may form a compound.

The bonding layer 13 may contain copper supplied from the copper plate 12.

In the bonded substrate 1 having a configuration as described above, the second portion 122 of the copper plate 12 and the fourth portion 132 of the bonding layer 13 fill the particle-defect hole 11h to suppress partial discharge starting at the particle-defect hole 11h. A crack formed by partial discharge starting at the particle-defect hole 11h and, further, electrical breakdown occurring due to development of the crack (electrical breakdown occurring in the second mode) are thereby suppressed in the bonded substrate 1. In description made below, the second portion 122 of the copper plate 12 and the fourth portion 132 of the bonding layer 13 filling the particle-defect hole 11h are generically referred to as a hole filling portion.

In the bonded substrate 1, electrical breakdown not starting at the particle-defect hole 11h but starting at the hole filling portion filling the particle-defect hole 11h (electrical breakdown occurring in the first mode) might occur. This electrical breakdown, however, can be found by conducting a withstand voltage test on the bonded substrate 1, and thus, by conducting the withstand voltage test on the bonded substrate 1 before shipment of the bonded substrate 1, shipment of the bonded substrate 1 not meeting required specifications of a withstand voltage due to the electrical breakdown can be avoided. Thus, in the present embodiment, electrical breakdown occurring in the mode is considered to have no problem based on the assumption that the withstand voltage test is conducted before shipment.

As described above, in the bonded substrate 1 according to the present embodiment, occurrence of a failure in a manner that the crack starting at the particle-defect hole 11h is formed due to partial discharge occurring when an electric field is applied and then electrical breakdown occurs due to development of the crack, is suppressed. Furthermore, a failure caused by electrical breakdown starting at the hole filling portion can be avoided at least after shipment of the bonded substrate 1.

More particularly, in the bonded substrate in which the particle-defect hole 11h has a depth of 10 μm or more, but the hole filling portion does not fill the particle-defect hole 11h, there is a possibility that the crack starting at the particle-defect hole 11h develops and electrical breakdown starting at the particle-defect hole 11h occurs. Thus, in a case where the particle-defect hole 11h has a depth of 10 μm or more, it is preferable to use a structure in which the hole filling portion fills the particle-defect hole 11h as in the present embodiment to avoid the occurrence of the electrical breakdown.

The particle-defect hole 11h, however, preferably has a depth of 60 μm or less. In a case where the particle-defect hole 11h has a depth of more than 60 μm, a recess might be formed in an upper main surface of the copper plate 12 when the second portion 122 of the copper plate 12 is formed. In a case where the particle-defect hole 11h has a depth of more than 60 μm, a crack might be formed in the silicon nitride ceramic substrate 11 when the copper plate 12 is bonded to the silicon nitride ceramic substrate 11.

The particle-defect hole 11h more preferably has a depth of 30 μm or less. In a case where the particle-defect hole 11h has a depth of 30 μm or less, a withstand voltage of the bonded substrate 1 is equivalent to a withstand voltage of a bonded substrate in which a copper plate is bonded to a silicon nitride ceramic substrate not having the particle-defect hole 11h.

In a case where the particle-defect hole 11h has a depth of more than 30 μm, the withstand voltage of the bonded substrate 1 is lower than the withstand voltage of the bonded substrate in which the copper plate is bonded to the silicon nitride ceramic substrate not having the particle-defect hole 11h. Even in case of the bonded substrate 1, however, the occurrence of the failure caused by electrical breakdown occurring due to development of the crack starting at the particle-defect hole 11h is suppressed by using the structure in which the hole filling portion fills the particle-defect hole 11h.

In the bonding structure in FIG. 2, the hole filling portion fills the particle-defect hole 11h as a whole. However, there are some cases that partial discharge starting at the particle-defect hole 11h is sufficiently suppressed, even when the hole filling portion fills only a part of the particle-defect hole 11h. In this case, the hole filling portion preferably fills 80% or more of the volume (capacity) of the particle-defect hole 11h, and more preferably fills 90% or more of the volume of the particle-defect hole 11h.

Furthermore, in the bonding structure in FIG. 2, the fourth portion 132 of the bonding layer 13 covers the inner surface 11i of the particle-defect hole 11h, and the second portion 122 of the copper plate 12 enters the particle-defect hole 11h on the fourth portion 132 of the bonding layer 13 to fill the particle-defect hole 11h as a whole. In the bonding structure in FIG. 2, the fourth portion 132 of the bonding layer 13 covers the inner surface 11i of the particle-defect hole 11h as a whole. Even in a case where the fourth portion 132 of the bonding layer 13 covers only a part of the inner surface 11i of the particle-defect hole 11h, however, the second portion 122 of the copper plate 12 may enter the particle-defect hole 11h on the fourth portion 132 of the bonding layer 13. In this case, the fourth portion 132 of the bonding layer 13 preferably covers 80% or more of the area of the inner surface 11i of the particle-defect hole 11h, and more preferably covers 90% or more of the area of the inner surface 11i of the particle-defect hole 11h.

3 Bonded Substrate Manufacturing Method

Figure 3:
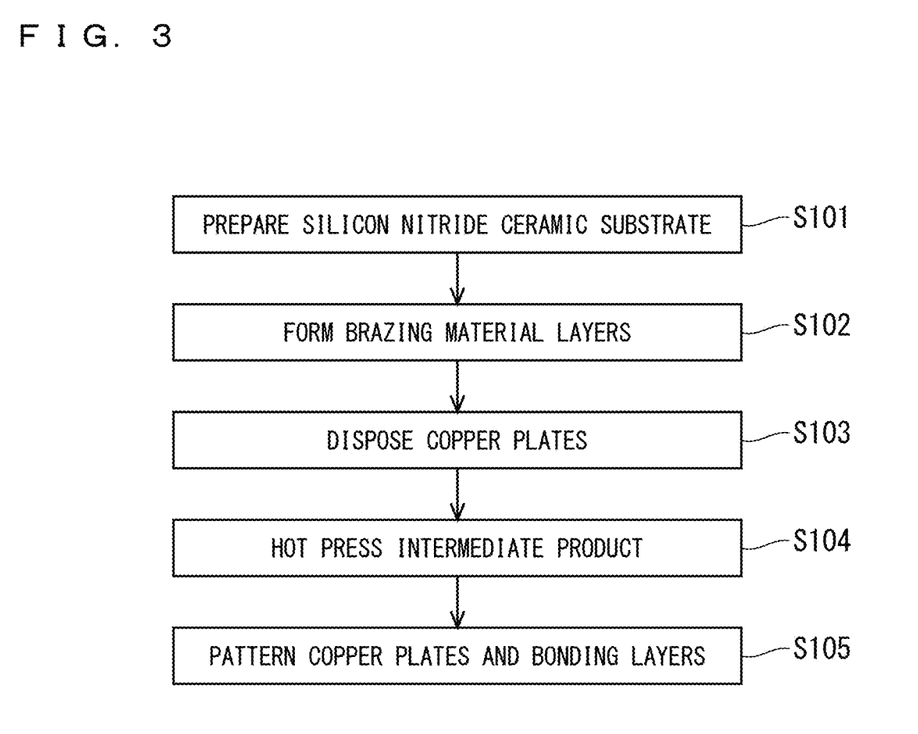
FIG. 3 is a flowchart showing a sequence in manufacturing the bonded substrate.
Figure 4:
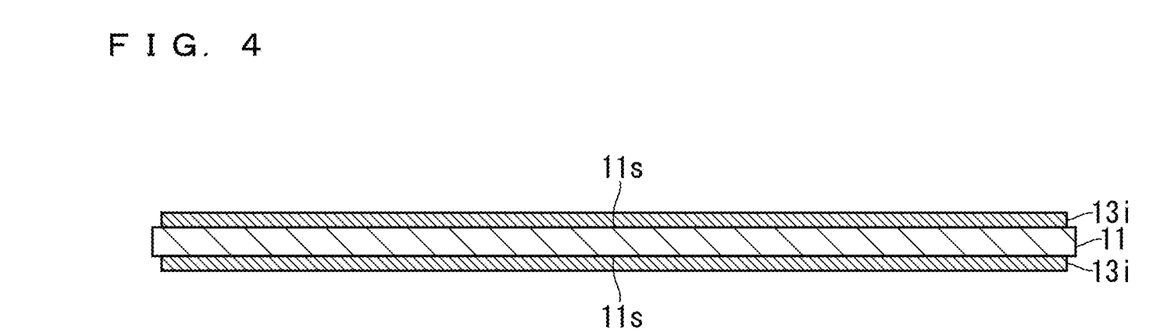
FIG. 4 is a cross-sectional view schematically showing an intermediate product obtained in the process of manufacturing the bonded substrate.
Figure 5:
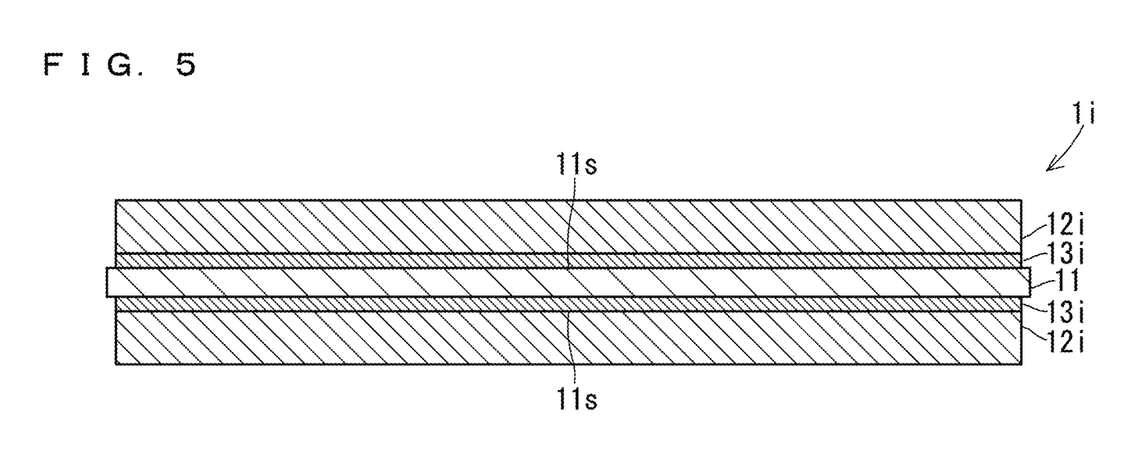
FIG. 5 is a cross-sectional view schematically showing an intermediate product obtained in the process of manufacturing the bonded substrate.
Figure 6:
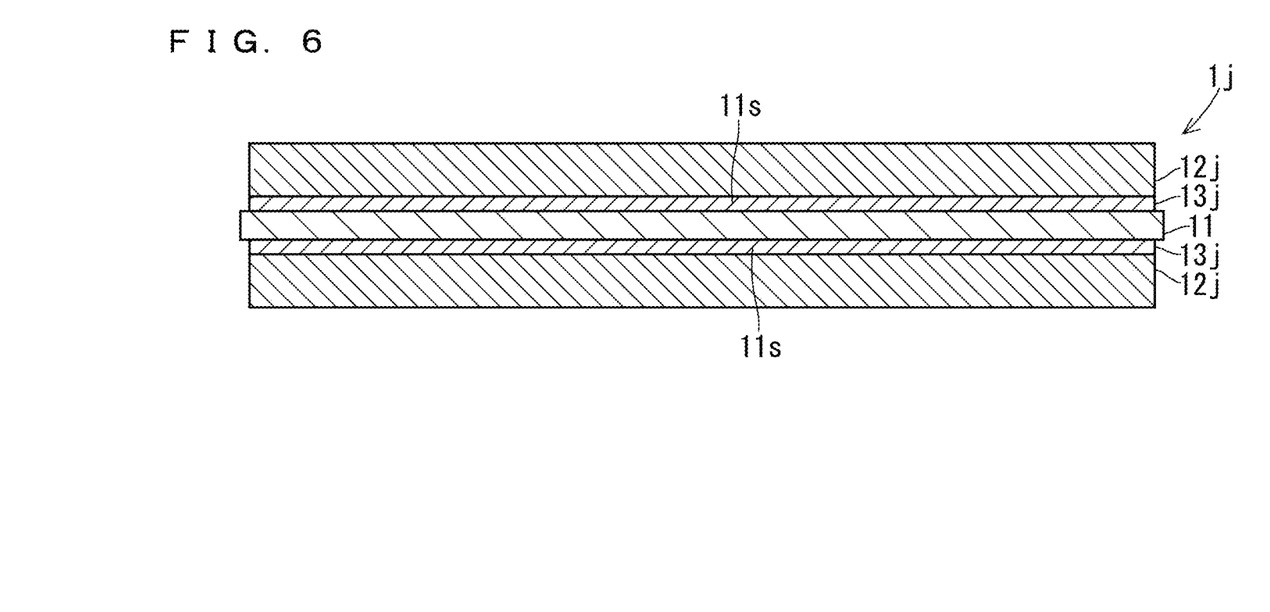
FIG. 6 is a cross-sectional view schematically showing an intermediate product obtained in the process of manufacturing the bonded substrate.

FIG. 3 is a flowchart showing a sequence in manufacturing the bonded substrate 1. FIGS. 4, 5, and 6 are cross-sectional views schematically showing intermediate products obtained in the process of manufacturing the bonded substrate 1.

In the manufacture of the bonded substrate 1, steps S101 to S105 shown in FIG. 3 are sequentially performed.

In step S101, the silicon nitride ceramic substrate 11 is prepared. The prepared silicon nitride ceramic substrate 11 has the main surfaces 11s and the particle-defect holes 11h exposed to the main surfaces 11s as described above.

In step S102, brazing material layers 13i are formed on the main surfaces 11s of the silicon nitride ceramic substrate 11 as shown in FIG. 4.

When the brazing material layers 13i are formed, a paste containing an active metal brazing material and a solvent is prepared. The paste may further contain a binder, a dispersant, an antifoaming agent, and the like. The prepared paste is then screen printed on the main surfaces 11s of the silicon nitride ceramic substrate 11 to form screen printed films on the respective main surfaces 11s of the silicon nitride ceramic substrate 11. The solvent contained in the formed screen printed films is then volatilized. The screen printed films are thereby changed into the respective brazing material layers 13i. The brazing material layers 13i contain the active metal brazing material. The brazing material layers 13i may be formed by a method different from this method.

The active metal brazing material contains an active metal hydride powder and a metal powder. The active metal hydride powder contains a hydride of at least one type of active metal selected from the group consisting of titanium and zirconium. The metal powder contains silver. The metal powder may contain metal other than silver. The metal other than silver is at least one type of metal selected from the group consisting of copper, indium, and tin. In a case where the active metal brazing material contains at least one type of metal selected from the group consisting of copper, indium, and tin and silver, the active metal brazing material has a lower melting point than silver.

The active metal brazing material preferably contains 40 wt % or more and 80 wt % or less silver.

The active metal brazing material is preferably formed of a powder having an average particle size of 0.1 μm or more and 10 μm or less. The average particle size can be obtained by measuring particle size distribution using a commercially available laser diffraction particle size distribution analyzer, and calculating a median diameter D50 from the measured particle size distribution. Use of the active metal brazing material formed of the powder having such a small average particle size for formation of the brazing material layers 13i enables the brazing material layers 13i to each have a small thickness.

The brazing material layers 13i each are preferably formed to have a thickness of 0.1 μm or more and 10 μm or less, and are more preferably formed to have a thickness of 0.1 μm or more and 5 μm or less.

In step S103, copper plates 12i are disposed on the respective formed brazing material layers 13i as shown in FIG. 5. An intermediate product 1i including the silicon nitride ceramic substrate 11, the copper plates 12i, and the brazing material layers 13i is thereby obtained.

In step S104, the obtained intermediate product 1i is hot pressed. During hot pressing, the active metal contained in the active metal brazing material constituting the brazing material layers 13i reacts with nitrogen contained in the silicon nitride ceramic substrate 11. A nitride of the active metal is thereby generated. A melt of the active metal brazing material is wet to the generated nitride of the active metal. Furthermore, the melt of the active metal brazing material is wet to the copper plates 12i. As a result, a substance constituent the melt of the active metal brazing material combines with substances constituent the silicon nitride ceramic substrate 11 and the copper plates 12i to generate bonding layers 13j bonding copper plates 12j and the silicon nitride ceramic substrate 11 as shown in FIG. 6.

In this case, the majority of each of the generated bonding layers 13j becomes the third portion 131 covering the flat region 11f (see FIG. 2), but a portion of each of the brazing material layers 13i enters the particle-defect hole 11h exposed to the main surface 11s of the silicon nitride ceramic substrate 11 with the progress of hot pressing. The fourth portion 132 of each of the bonding layers 13j filling the particle-defect hole 11h is thereby formed. Furthermore, in this situation, a portion of each of the softened copper plates 12i enters the particle-defect hole 11h. The second portion 122 of each of the copper plates 12j filling the particle-defect hole 11h is thereby formed in addition to the first portion 121 disposed over the flat region 11f. An intermediate product 1j including the silicon nitride ceramic substrate 11, the copper plates 12j, and the bonding layers 13j is thereby obtained.

In a case where the intermediate product 1i is hot pressed, the intermediate product 1i is preferably heated in accordance with a temperature profile having a maximum temperature of 800° C. or more and 900° C. or less while being pressurized in a vacuum along a thickness direction of the silicon nitride ceramic substrate 11 in accordance with a contact pressure profile having a maximum contact pressure of 5 MPa or more and 30 MPa or less. The copper plates 12i can thereby be bonded to the silicon nitride ceramic substrate 11 even in a case where the brazing material layers 13i each have a small thickness of 0.1 μm or more and 10 μm or less.

Figure 7:
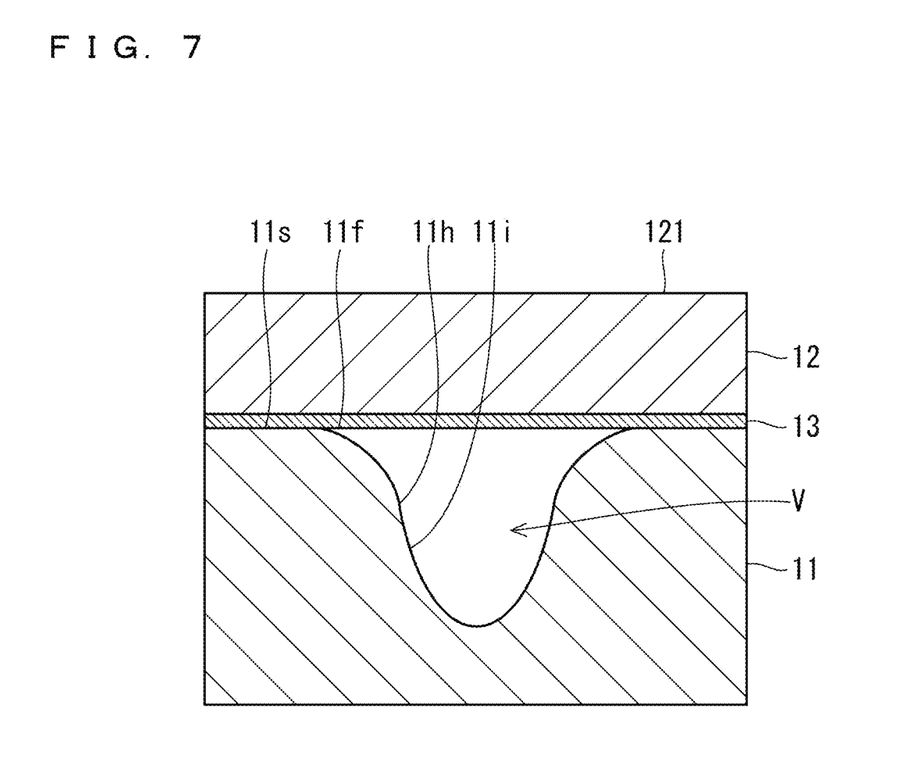
FIG. 7 is an enlarged cross-sectional view schematically showing a portion of a bonded substrate compared with the bonded substrate.

FIG. 7 is an enlarged cross-sectional view schematically showing a portion of a bonded substrate manufactured under conditions of insufficient pressurization of the intermediate product 1i compared to pressurization in accordance with the above-mentioned contact pressure profile, which is shown for comparison with the bonded substrate 1 according to the present embodiment.

The bonded substrate shown in FIG. 7 differs from the bonded substrate 1 according to the present embodiment shown in FIG. 2 in that the bonding layer 13 does not include the fourth portion 132 filling the particle-defect hole 11h to cover the inner surface 11i of the particle-defect hole 11h, and the copper plate 12 does not include the second portion 122 filling the particle-defect hole 11h.

The melt of the active metal brazing material has high wettability to each of the copper plates 12i. The melt of the active metal brazing material present over the particle-defect hole 11h is thus likely to adhere to the copper plate 12i. In a case where pressurization of the intermediate product 1i is insufficient, even when a portion of the melt of the active metal brazing material present in the flat region 11f around the particle-defect hole 11h enters the particle-defect hole 11h, the entering melt can easily be brought back to the flat region 11f around the particle-defect hole 11h. Thus, in a case where pressurization of the intermediate product 1i is insufficient, the melt of the active metal brazing material present near the particle-defect hole 11h tends to have difficulty entering the particle-defect hole 11h.

A space filling ratio of the brazing material powder is only approximately 50% to 60% in the first place. Thus, when pressurization of the intermediate product 1i is insufficient in a case where the active metal brazing material is in a melting state due to hot pressing, at most only approximately 50% to 60% of the particle-defect hole 11h is filled, even if the active metal brazing material in the form of a powder completely fills the particle-defect hole 11h.

For these reasons, the bonding layer 13 and the copper plate 12 do not sufficiently fill the particle-defect hole 11h when contact pressure to the intermediate product 1i is insufficient. For example, only less than 80% of the volume of the particle-defect hole 11h is filled. In an extreme case, the active metal brazing material does not enter the particle-defect hole 11h, and thus the copper plate does not enter the particle-defect hole 11h, and, as a result, the particle-defect hole 11h can remain as a void V as shown in FIG. 7. For these reasons, it is necessary to pressurize the intermediate product 1i under sufficient contact pressure in manufacturing the bonded substrate 1 to push the active metal brazing material and, further, the copper plate, into the particle-defect hole 11h.

During hot pressing of the intermediate product 1i, all or some of silver, copper, indium, and tin contained in the brazing material layer 13i may be diffused into the silicon nitride ceramic substrate 11 and/or the copper plate 12i. During hot pressing of the intermediate product 1i, nitrogen and/or silicon contained in the silicon nitride ceramic substrate 11 may be diffused into the brazing material layer 13i. Copper contained in the copper plate 12i may be diffused into the brazing material layer 13i. In step S105, the copper plates 12j and the bonding layers 13j are patterned. The bonded substrate 1 in which the copper plates 12 and the bonding layers 13 are patterned to expose portions of the main surfaces 11s of the silicon nitride ceramic substrate 11 as shown in FIG. 1 is thereby obtained.

4 Influence of Maximum Contact Pressure and Maximum Temperature

An experiment was conducted to evaluate the influence of the maximum contact pressure of the contact pressure profile and the maximum temperature of the temperature profile used for hot pressing performed in the process of manufacturing the bonded substrate 1 on an internal state of the particle-defect hole 11h.

As for conditions of hot pressing, the maximum contact pressures in the contact pressure profiles were varied in six levels of 1 MPa, 5 MPa, 10 MPa, 20 MPa, 30 MPa, and 35 MPa, and the maximum temperatures in the temperature profiles were varied in four levels of 750° C., 800° C., 900° C., and 950° C. as shown in Table 1. That is to say, the intermediate product 1i was heated in accordance with the temperature profile having any of the maximum temperatures shown in Table 1 while being pressurized along the thickness direction of the silicon nitride ceramic substrate 11 in accordance with the contact pressure profile having any of the maximum contact pressures shown in Table 1 to manufacture each of the bonded substrates 1.

A cross section of each of the manufactured bonded substrates 1 was observed with a scanning electron microscope (SEM) to obtain an SEM image. The internal state of the particle-defect hole 11h was checked with reference to the obtained SEM image. Results of evaluation of the internal state of the particle-defect hole 11h are shown in Table 1.

In Table 1, results of evaluation of the internal state of the particle-defect hole 11h marked with circles each indicate that all the following requirements are met:

The fourth portion 132 of the bonding layer 13 covers 80% or more of the area of the inner surface 11i of the particle-defect hole 11h;

The hole filling portion fills 80% or more of the volume of the particle-defect hole 11h; and No crack is formed in the silicon nitride ceramic substrate 11.

In Table 1, results of evaluation of the internal state of the particle-defect hole 11h marked with circles with asterisks each indicate that all the following requirements are met:

The fourth portion 132 of the bonding layer 13 covers 80% or more of the area of the inner surface 11i of the particle-defect hole 11h;

The hole filling portion fills 80% or more of the volume of the particle-defect hole 11h; and One or more cracks are formed in the silicon nitride ceramic substrate 11.

In Table 1, results of evaluation of the internal state of the particle-defect hole 11h marked with crosses each indicate that all the following requirements are met:

The fourth portion 132 of the bonding layer 13 covers only 70% or less of the area of the inner surface 11i of the particle-defect hole 11h; and The hole filling portion fills only 70% or less of the volume of the particle-defect hole 11h.

TABLE 1

|  |  | MAXIMUM CONTACT PRESSURE | | | | | |
|---|---|---|---|---|---|---|---|
|  |  | 1 MPa | 5 MPa | 10 MPa | 20 MPa | 30 MPa | 35 MPa |
| MAXIMUM TEMPERATURE | 750° C. | x | x | x | x | x | x |
|  | 800° C. | x | o | o | o | o | o* |
|  | 900° C. | x | o | o | o | o | o* |
|  | 950° C. | x | o* | o* | o* | o* | o* |

First, various bonded substrates 1 were manufactured by the above-mentioned method for manufacturing the bonded substrate 1. The depth of the particle-defect hole 11h present in the silicon nitride ceramic substrate 11 varied from 10 μm to 60 μm. A titanium hydride was used as an active metal hydride contained in the active metal brazing material. Silver was used as the metal other than the active metal contained in the active metal brazing material.

As shown in Table 1, in each of the bonded substrates 1 manufactured under a maximum contact pressure of 5 MPa or more and 30 MPa or less and at a maximum temperature of 800° C. or more and 900° C. or less, the fourth portion 132 of the bonding layer 13 covered 80% or more of the area of the inner surface 11i of the particle-defect hole 11h, the hole filling portion filled 80% or more of the volume of the particle-defect hole 11h, and no crack was formed in the silicon nitride ceramic substrate 11.

On the other hand, in each of the bonded substrates 1 manufactured under a maximum contact pressure of less than 5 MPa or at a maximum temperature of less than 800° C., the fourth portion 132 of the bonding layer 13 covered only 70% or less of the area of the inner surface 11*i* of the particle-defect hole 11*h*, and the hole filling portion filled only 70% or less of the volume of the particle-defect hole 11*h*.

In each of the bonded substrates 1 manufactured under a maximum contact pressure of more than 30 MPa or at a maximum temperature of more than 900° C., the fourth portion 132 of the bonding layer 13 covered 80% or more of the area of the inner surface 11*i* of the particle-defect hole 11*h*, and the hole filling portion filled 80% or more of the volume of the particle-defect hole 11*h*, but one or more cracks were formed in the silicon nitride ceramic substrate 11. The reason why the cracks are formed in the silicon nitride ceramic substrate 11 in each of the bonded substrates 1 manufactured at a maximum temperature of more than 900° C. is that the copper plates 12*i* are excessively softened and flare during hot pressing, and, as a result, the cracks are formed in the silicon nitride ceramic substrate 11.

It is understood from the experiment that, by performing hot pressing under a maximum contact pressure of 5 MPa or more and 30 MPa or less and at a maximum temperature of 800° C. or more and 900° C. or less in the process of manufacturing the bonded substrate 1, the fourth portion 132 of the bonding layer 13 can cover 80% or more of the area of the inner surface 11*i* of the particle-defect hole 11*h*, the hole filling portion can fill 80% or more of the volume of the particle-defect hole 11*h*, and, further, formation of any cracks in the bonded substrate 1 can be prevented.

5 Influence of Depth of Particle-Defect Hole

An experiment was conducted to evaluate the influence of the depth of the particle-defect hole in the bonded substrate 1 on how electrical breakdown occurs.

First, bonded substrates 1 were manufactured by the above-mentioned method for manufacturing the bonded substrate 1. Five silicon nitride ceramic substrates 11 were prepared for each of four ranges of a maximum depth t of the particle-defect hole 11*h* of t≤10 μm, 10 μm<t≤20 μm, 20 μm<t≤30 μm, and 30 μm<t≤60 μm shown in Table 2. Titanium was used as the active metal contained in the active metal brazing material. Silver was used as the metal other than the active metal contained in the active metal brazing material.

As for conditions of hot pressing, the maximum contact pressures in the contact pressure profiles were varied in two levels of 20 MPa and 1 MPa shown in Table 2, and a maximum temperature in the temperature profile was set to 830° C. That is to say, the intermediate product 1*i* was manufactured using the silicon nitride ceramic substrate 11 having the particle-defect hole 11*h* having the maximum depth t in any of the ranges shown in Table 2, and the manufactured intermediate product 1*i* was heated in accordance with the temperature profile having a maximum temperature of 830° C. while being pressurized along the thickness direction of the silicon nitride ceramic substrate 11 in accordance with the contact pressure profile having one of the maximum contact pressures shown in Table 2 to manufacture each of the bonded substrates 1.

A cross section of each of the manufactured bonded substrates 1 was observed with the SEM to obtain an SEM image. The internal state of the particle-defect hole 11*h* was checked with reference to the obtained SEM image.

Figure 8:
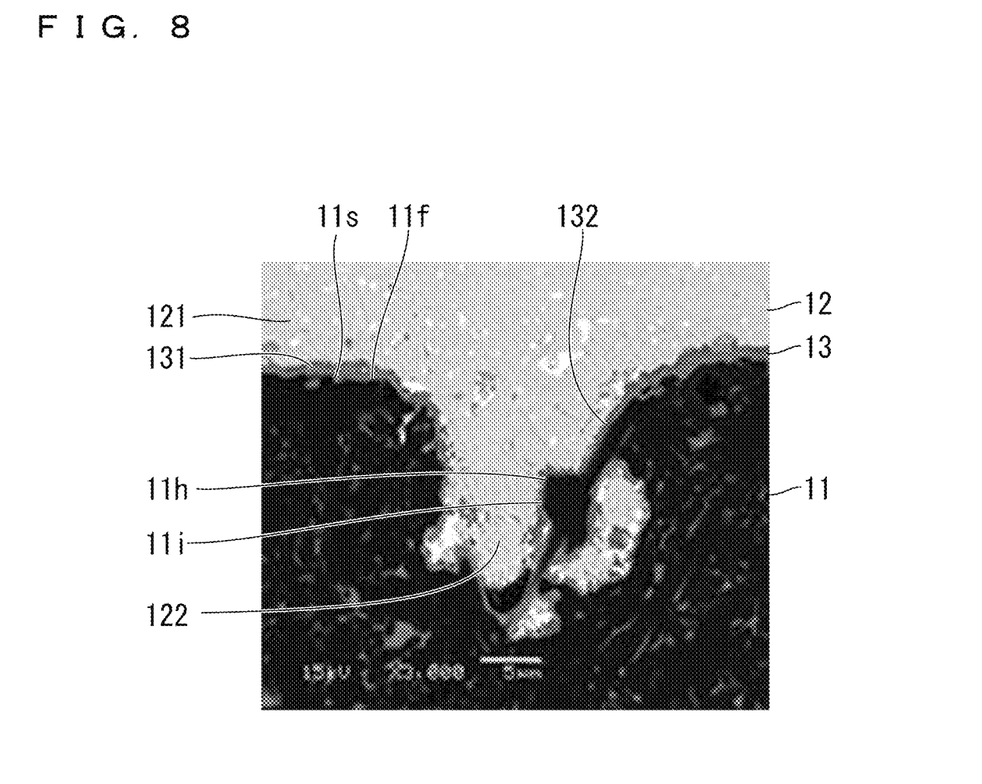
FIG. 8 is a cross-sectional scanning electron microscope (SEM) image of the bonded substrate.

FIG. 8 is a cross-sectional SEM image of the bonded substrate 1 manufactured by hot pressing in accordance with the contact pressure profile having a maximum contact pressure of 20 MPa and the temperature profile having a maximum temperature of 830° C. shown as one example. It is confirmed from FIG. 8 that the hole filling portion fills almost 100% of the volume of the particle-defect hole 11*h*.

As a result, as shown in Table 2, the hole filling portion filled 80% to 100% of the volume of the particle-defect hole 11*h* in a case where the maximum contact pressure was 20 MPa. The hole filling portion filled 50% to 75% of the volume of the particle-defect hole 11*h* in a case where the maximum contact pressure was 1 MPa.

Each of the bonded substrates 1 in which 80% to 100% of the volume of the particle-defect hole 11*h* is filled obtained in a case where the maximum contact pressure was 20 MPa is hereinafter referred to as a high filling degree substrate, and each of the bonded substrates 1 in which 50% to 75% of the volume of the particle-defect hole 11*h* is filled obtained in a case where the maximum contact pressure was 1 MPa is hereinafter referred to as a low filling degree substrate.

Furthermore, a withstand voltage test was conducted on each of the manufactured bonded substrates 1 to measure a withstand voltage of the bonded substrate 1 for electrical breakdown. The withstand voltage was evaluated by increasing a voltage in steps of 0.5 kV, and keeping the voltage for ten minutes. The measured withstand voltage of the bonded substrate 1 is shown in Table 2. Table 2 shows an average value of withstand voltages of the bonded substrates 1 belonging to each of the four ranges of the maximum depth t of the particle-defect hole 11*h*.

Furthermore, a partial discharge test was conducted on each of the manufactured bonded substrates 1 to measure a partial discharge voltage of the bonded substrate 1. More specifically, a voltage was increased in steps of 0.5 kV/sec, and a discharge voltage when the amount of discharge of the bonded substrate 1 reached 10 pC was obtained as the partial discharge voltage. The partial discharge voltage was measured using a partial discharge test system from SOKEN ELECTRIC CO., LTD. The measured partial discharge voltage of the bonded substrate 1 is shown in Table 2.

In a case where the partial discharge voltage has an extremely high measured value of 7 kV or more, the bonded substrate 1 can be evaluated so that virtually no partial discharge occurs in the bonded substrate 1. In contrast, in a case where the partial discharge voltage of the bonded substrate 1 has a measured value of less than 7 kV, the bonded substrate 1 can be evaluated so that the partial discharge might occur in the bonded substrate 1.

TABLE 2

| | MAXIMUM CONTACT PRESSURE 20 MPa (HIGH FILLING DEGREE SUBSTRATE) | | | MAXIMUM CONTACT PRESSURE 1 MPa (LOW FILLING DEGREE SUBSTRATE) | | |
|---|---|---|---|---|---|---|
| MAXIMUM DEPTH t | RATO AT WHICH PARTICLE-DEFECT HOLE IS FILLED | WITHSTAND VOLTAGE | PARTIAL DISCHARGE VOLTAGE | RATO AT WHICH PARTICLE-DEFECT HOLE IS FILLED | WITHSTAND VOLTAGE | PARTIAL DISCHARGE VOLTAGE |
| t ≤ 10 μm | 100% | 8 kV | 7 kV | 65%-75% | 8 kV | 7 kV |
| 10 μm < t ≤ 20 μm | 90%-95% | 8 kV | 7 kV | 65%-70% | 8 kV | 5 kV |
| 20 μm < t ≤ 30 μm | 85%-95% | 8 kV | 7 kV | 60%-70% | 8 kV | 4 kV |
| 30 μm < t ≤ 60 μm | 80%-90% | 5 kV | 7 kV | 50%-70% | 7 kV | 3 kV |

As shown in Table 2, in a case of the high filling degree substrate, the withstand voltage was 8 kV when the particle-defect hole 11h had a maximum depth t of 30 μm or less, and was 5 kV when the particle-defect hole 11h had a maximum depth t of more than 30 μm. That is to say, it is confirmed, for the high filling degree substrate, that the withstand voltage tends to be reduced when the particle-defect hole 11h has a maximum depth t of more than 30 μm.

In contrast, the partial discharge voltage of the high filling degree substrate was 7 kV regardless of whether the particle-defect hole 11h had a maximum depth t of 30 μm or less. That is to say, each high filling degree substrate was evaluated so that partial discharge does not occur in the high filling degree substrate.

On the other hand, in a case of the low filling degree substrate, the withstand voltage was 8 kV when the particle-defect hole 11h had a maximum depth of 30 μm or less, and was 7 kV when the particle-defect hole 11h had a maximum depth of more than 30 μm. That is to say, it is confirmed, for the low filling degree substrate, that the withstand voltage tends to be reduced when the particle-defect hole 11h has a maximum depth t of more than 30 μm.

The partial discharge voltage of the low filling degree substrate had a value varying with the maximum depth t of the particle-defect hole 11h. Specifically, the partial discharge voltage was 7 kV when the maximum depth t was 10 μm or less, was 5 kV when the maximum depth t was more than 10 μm and 20 μm or less, was 4 kV when the maximum depth t was more than 20 μm and 30 μm or less, and was 3 kV when the maximum depth t was more than 30 μm. That is to say, the low filling degree substrate was evaluated so that partial discharge might occur when the particle-defect hole 11h has a maximum depth of more than 10 μm.

The low filling degree substrate in which the maximum depth t was more than 30 μm had a higher withstand voltage than the high filling degree substrate in which the maximum depth t had substantially the same value, but had a lower partial discharge voltage than the high filling degree substrate.

It can be said, from the above-mentioned results, that there is little difference in voltage performance between the high filling degree substrate and the low filling degree substrate in each of which the particle-defect hole 11h has a maximum depth t of 10 μm or less, and they each have a sufficient withstand voltage, and partial discharge does not occur in each of them. On the other hand, it can be said that, in a case of the high filling degree substrate and the low filling degree substrate in each of which the maximum depth t is more than 10 μm and 60 μm or less, partial discharge might occur in the low filling degree substrate, whereas partial discharge does not occur in the high filling degree substrate. It can thus be said that, in a case where the bonded substrate is the high filling degree substrate in which the particle-defect hole has a maximum depth of 10 μm or more and 60 μm or less, and the hole filling portion fills 80% or more of the volume of the particle-defect hole, partial discharge starting at the particle-defect hole does not occur, and thus it is not necessary to conduct the partial discharge test prior to shipment as a product. In other words, it can be said that the bonded substrate can be shipped as a product when only passing the withstand voltage test, which is conducted more easily than the partial discharge test.

In particular, the bonded substrate having a higher withstand voltage can be achieved in a case where the particle-defect hole has a maximum depth of 30 μm or less.

In a case where the bonded substrate is the low filling degree substrate in which the hole filling portion fills only less than 80% of the volume of the particle-defect hole, the bonded substrate cannot be shipped as a product unless the bonded substrate passes both the withstand voltage test and the partial discharge test conducted before shipment as a product. In a case where only the withstand voltage test is conducted, and the partial discharge test is not conducted, shipment of the bonded substrate in which partial discharge starting at the particle-defect hole might occur cannot be suppressed.

While the invention has been described in detail, the foregoing description is in all aspects illustrative and not restrictive. It is therefore understood that numerous unillustrated modifications can be devised without departing from the scope of the invention.

What is claimed is:

1. A bonded substrate suitable for use as an insulating heat-dissipating substrate for mounting a power semiconductor device, the bonded substrate comprising:
   a ceramic substrate having a main surface and a particle-defect hole, the main surface having a flat region having a maximum height Rz of 10 μm or less, the particle-defect hole being exposed to the main surface, imparting flatness lower than flatness of the flat region to a part of the main surface, and having a depth of 10 μm or more and 60 μm or less;
   a copper plate including a first portion disposed over the flat region and a second portion filling the particle-defect hole; and
   a bonding layer including a third portion covering the flat region and a fourth portion filling the particle-defect hole, and bonding the copper plate to the main surface, wherein
   the second portion and the fourth portion fill 80% or more of a volume of the particle-defect hole.

2. The bonded substrate according to claim 1, wherein the particle-defect hole has a depth of 30 μm or less.

3. The bonded substrate according to claim 2, wherein the particle-defect hole has an inner surface, and the fourth portion covers the inner surface.

4. The bonded substrate according to claim 3, wherein the fourth portion covers 80% or more of an area of the inner surface.

5. The bonded substrate according to claim 4, wherein the ceramic substrate comprises a silicon nitride ceramic substrate.

6. The bonded substrate according to claim 4, wherein the bonding layer containing a compound of at least one type of active metal selected from the group consisting of titanium and zirconium with nitrogen and/or silicon, further containing at least one type of metal selected from the group consisting of silver, copper, indium, and tin.

7. The bonded substrate according to claim 3, wherein the ceramic substrate comprises a silicon nitride ceramic substrate.

8. The bonded substrate according to claim 2, wherein the ceramic substrate comprises a silicon nitride ceramic substrate.

9. The bonded substrate according to claim 1, wherein the particle-defect hole has an inner surface, and the fourth portion covers the inner surface.

10. The bonded substrate according to claim 9, wherein the fourth portion covers 80% or more of an area of the inner surface.

11. The bonded substrate according to claim 10, wherein the ceramic substrate comprises a silicon nitride ceramic substrate.

12. The bonded substrate according to claim 9, wherein the ceramic substrate comprises a silicon nitride ceramic substrate.

13. The bonded substrate according to claim 1, wherein the ceramic substrate comprises a silicon nitride ceramic substrate.

* * * * *